(12) United States Patent
Seok et al.

(10) Patent No.: US 11,121,265 B2
(45) Date of Patent: Sep. 14, 2021

(54) SILICON CARBIDE TRENCH SCHOTTKY BARRIER DIODE USING POLYSILICON AND A METHOD OF MANUFACTURING THE SAME

(71) Applicant: Korea Electrotechnology Research Institute, Changwon-si (KR)

(72) Inventors: O Gyun Seok, Busan (KR); In Ho Kang, Jinju-Si (KR); Sang Cheol Kim, Changwon-si (KR); Hyoung Woo Kim, Changwon-si (KR); Moon Kyong Na, Changwon-si (KR); Jeong Hyun Moon, Gimhae-si (KR); Wook Bang, Changwon-si (KR)

(73) Assignee: KOREA ELECTROTECHNOLOGY RESEARCH INSTITUTE

( * ) Notice: Subject to any disclaimer, the term of this patent is extended or adjusted under 35 U.S.C. 154(b) by 0 days.

(21) Appl. No.: 16/655,477

(22) Filed: Oct. 17, 2019

(65) Prior Publication Data
US 2020/0098936 A1 Mar. 26, 2020

Related U.S. Application Data

(63) Continuation of application No. PCT/KR2018/004407, filed on Apr. 17, 2018.

(30) Foreign Application Priority Data

Apr. 17, 2017 (KR) .................. 10-2017-0049043

(51) Int. Cl.
*H01L 29/872* (2006.01)
*H01L 29/16* (2006.01)
(Continued)

(52) U.S. Cl.
CPC ...... *H01L 29/8725* (2013.01); *H01L 21/0495* (2013.01); *H01L 29/1608* (2013.01); *H01L 29/47* (2013.01); *H01L 29/6606* (2013.01)

(58) Field of Classification Search
CPC .................. H01L 21/0495; H01L 29/47
See application file for complete search history.

(56) References Cited

U.S. PATENT DOCUMENTS

| 2009/0261427 A1* | 10/2009 | Chao | ................ H01L 29/66356 257/409 |
| 2015/0041828 A1* | 2/2015 | Nagao | ................ H01L 29/0692 257/77 |
| 2016/0099351 A1* | 4/2016 | Hebert | ................ H01L 29/7828 257/331 |

* cited by examiner

*Primary Examiner* — Farun Lu
*Assistant Examiner* — Mohammad A Rahman
(74) *Attorney, Agent, or Firm* — Park & Associates IP Law, P.C.

(57) ABSTRACT

The present invention relates to a silicon carbide trench Schottky barrier diode using polysilicon and a method of manufacturing same. The diode has a low turn-on voltage and an improved reverse characteristic. The method includes sequentially forming an epitaxial layer, a polysilicon layer, an oxide film, and a photoresist film on a silicon carbide substrate, patterning the photoresist to form a photoresist pattern, etching the oxide film using the photoresist pattern as an etching mask to form an oxide film pattern, etching the polysilicon layer using the oxide film pattern as an etching mask to form a polysilicon pattern, removing the photoresist pattern, forming an epitaxial pattern by etching the epitaxial layer down to a predetermined depth using the oxide film pattern as an etching mask, and removing the oxide film pattern to produce a trench.

8 Claims, 10 Drawing Sheets

(51) Int. Cl.
*H01L 29/47* (2006.01)
*H01L 21/04* (2006.01)
*H01L 29/66* (2006.01)

Electric distribution of poly-Si/Ni TSBD and Ti/Ni TSBS

FIG. 3

Simulation results of reverse breakdown characteristics

FIG. 4

Experimental results of forward I-V characteristics

FIG. 5

Experimental results of reverse I-V characteristice

FIG. 6

SILICON CARBIDE TRENCH SCHOTTKY BARRIER DIODE USING POLYSILICON AND A METHOD OF MANUFACTURING THE SAME

REFERENCE TO RELATED APPLICATIONS

This is a continuation of International Patent Application PCT/KR2018/004407 filed on Apr. 17, 2018, which designates the United States and claims priority of Korean Patent Application No. 10-2017-0049043 filed on Apr. 17, 2017, the entire contents of which are incorporated herein by reference.

FIELD OF THE INVENTION

The present invention relates to a silicon-carbide trench Schottky barrier diode using polysilicon and a method of manufacturing same. More particularly, the present invention relates to a polysilicon-based silicon-carbide trench Schottky barrier diode having a low turn-on voltage and a good reverse characteristic and to a method of manufacturing same.

BACKGROUND OF THE INVENTION

Among existing power semiconductor devices, silicon carbide (SiC) semiconductor devices have been attracting attention because they are superior to conventional silicon (Si) semiconductor devices in terms of high power and good switching performance due to beneficial properties such as high breakdown voltage, high thermal conductivity, and high electron drift velocity.

A Schottky barrier diode (SBD), which is one of the SiC semiconductor devices, provides rectifying action by using a Schottky barrier formed by a metal-SiC junction.

In particular, a Schottky barrier height (SBH) is an important parameter in action of a Schottky barrier diode. The Schottky barrier height represents a Schottky barrier against a reverse leakage current. Since the SBH is lower than the built-in potential of a PN diode, a Schottky barrier diode exhibits a high forward current characteristic and performs unipolar action, resulting in a short reverse recovery time.

Here, the Schottky barrier height (SBH) is simply a difference between a metal work function and a semiconductor work function. When a semiconductor for a Schottky barrier diode is determined to be a specific material (for example, silicon carbide (SiC)), the value of a semiconductor work function is accordingly determined. Therefore, the Schottky barrier height depends on the work function of a metal used. That is, the turn-on and turn-off characteristics of the diode vary depending on whether a metal that is used for the diode has a large work function or a small work function.

For example, when titanium is used as the metal, since the work function of titanium is 4.3 eV and the work function of silicon carbide is 3.2 eV, the Schottky barrier height (SBH) is 1.1 eV. On the other hand, when nickel is used as the metal, since the work function of nickel is 5.0 eV and the work function of silicon carbide is 3.2 eV, the Schottky barrier height (SBH) is 1.8 eV. When only the forward characteristic is taken into consideration, a single metal such as titanium may be used. However, in this case, a good reverse characteristic cannot be obtained. That is, it is difficult to improve both the forward and reverse characteristics when a single metal scheme is used.

Accordingly, in order to improve both the forward and reverse characteristics of a diode, a trench Schottky barrier controlled Schottky diode (TSBS) in which a trench structure and a plurality of metals having different work functions are used has been developed.

Figure 1:
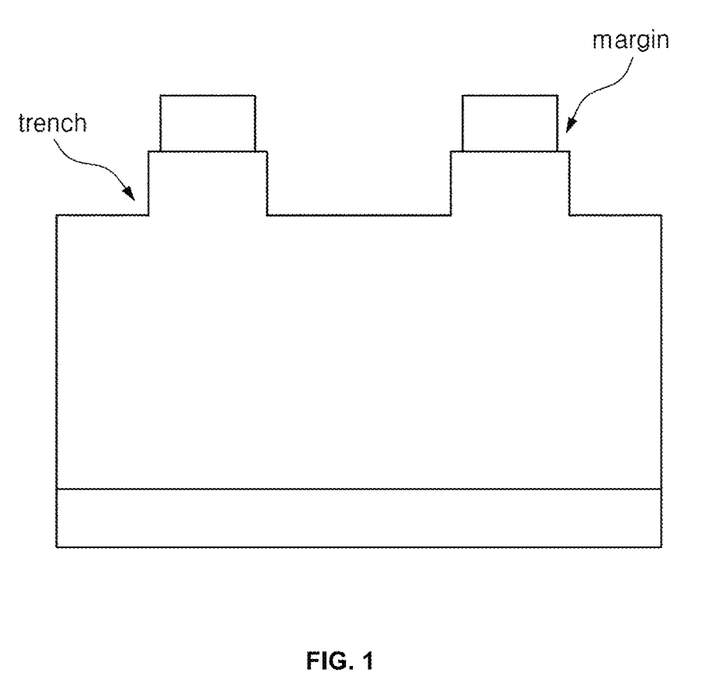
FIG. 1 is a diagram illustrating a margin that must be provided when an electrode formation process follows a trench formation process.

FIG. 1 illustrates an alignment margin that must be secured when an electrode is formed after trench formation. As illustrated in FIG. 1, in the case of a trench Schottky barrier controlled Schottky diode, when a trench structure is formed first and an electrode is formed subsequently, a problem that an alignment margin, which results in inefficient space utilization, must be provided.

That is, after the trench structure is formed, a process of aligning the pattern of electrodes to be formed with the pattern of the trenches that have been formed must be performed. At this time, an alignment margin must be taken into account due to a fear of occurrence of an error in alignment. Therefore, there is a problem that a spatial loss occurs. Therefore, research and development of technology for solving this problem are urgently required.

SUMMARY OF THE INVENTION

The present invention has been made to solve the problems occurring in the related art, and an objective of the present invention is to provide a silicon carbide trench Schottky barrier diode having a low turn-on voltage and an improved reverse characteristic and a method of manufacturing same.

The technical gist of the present invention to accomplish one of the above-described objectives is a method of manufacturing a silicon carbide trench Schottky barrier diode using polysilicon, the method including: a first step of sequentially forming an epitaxial layer, a polysilicon layer, an oxide film, and a photoresist film on a silicon carbide substrate; a second step of patterning the photoresist film to form a photoresist pattern and etching the oxide film using the photoresist pattern as an etching mask to form an oxide film pattern; a third step of etching the polysilicon layer using the oxide film pattern as an etching mask to form a polysilicon pattern and subsequently removing the photoresist pattern; and a fourth step of etching the epitaxial layer down to a predetermined depth using the oxide film pattern as an etching mask and subsequently removing the oxide film pattern to form a trench.

Preferably, the fourth step may include a process of providing an electrode on a lower surface of the silicon carbide substrate.

Preferably, the method may further include a fifth step of forming a metal deposition layer on the entire surface of the epitaxial layer as well as on the polysilicon pattern, wherein the fifth step is performed after the fourth step.

Preferably, in the fifth step, the metal is at least one metal selected from platinum (Pt), nickel (Ni), gold (Au), palladium (Pd), and molybdenum (Mo).

Preferably, in the first step, the oxide film is made of silicon dioxide ($SiO_2$).

The technical gist of the present invention to accomplish one of the above-described objectives is a silicon carbide trench Schottky barrier diode using polysilicon, the diode being formed using a structure in which an epitaxial layer, a polysilicon layer, an oxide film, and a photoresist film are stacked in this order on a silicon carbide substrate, the diode including: the silicon carbide substrate; an epitaxial pattern formed by etching a bottom portion of the epitaxial layer; a polysilicon pattern formed on the epitaxial pattern; a metal layer formed on the entire area of an upper surface of the epitaxial layer as well as on the polysilicon pattern; and an electrode formed on a lower surface of the silicon carbide substrate, wherein the epitaxial pattern and the polysilicon pattern are self-aligned.

Preferably, the metal layer may be made of at least one of platinum (Pt), nickel (Ni), gold (Au), palladium (Pd), and molybdenum (Mo).

Preferably, the oxide film may be made of silicon dioxide (SiO2).

The silicon carbide trench Schottky barrier diode and its manufacturing method using polysilicon according to the present invention, which are described in the section "technical solution", are advantageous in terms of a low turn-on voltage obtained by combining polysilicon and nickel and a reduced gap between trenches due to elimination of an alignment margin, which is obtained by using a self-aligning process. Thus, the present invention has an advantage of improving both the forward and reverse diode characteristics.

DETAILED DESCRIPTION OF THE INVENTION

Hereinafter, preferred embodiments of the present invention will be described in detail with reference to the accompanying drawings.

FIGS. 2A to 2H are cross-sectional views illustrating a manufacturing method according to a preferred embodiment of the present invention. With reference to FIGS. 2A to 2H, a silicon carbide trench Schottky barrier diode using polysilicon, according to a preferred embodiment of the present invention, is manufactured through a first step S10, a second step S20, a third step S30, a fourth step, and a fifth step S50.

A silicon carbide trench Schottky barrier diode formed by sequentially stacking an epitaxial layer, a polysilicon layer, an oxide film, and a photoresist film on top of a silicon carbide substrate through the first through fifth steps includes: a silicon carbide substrate; an epitaxial pattern formed by etching a bottom portion of the epitaxial layer; a polysilicon pattern formed on the epitaxial pattern; a metal layer formed on the entire surface of the epitaxial layer as well as on the polysilicon pattern; and an electrode formed on a lower surface of the silicon carbide substrate, in which the epitaxial pattern and the polysilicon pattern are self-aligned.

Figure 2A:
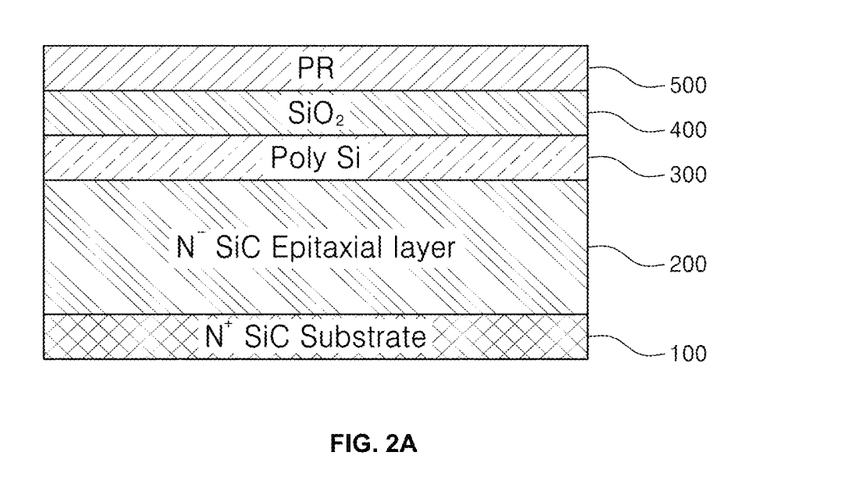
FIGS. 2A to 2H are cross-sectional views sequentially illustrating a manufacturing method according to one embodiment of the present invention.

The first step S10 is to form an epitaxial layer 200, a polysilicon layer 300, an oxide film 400, and a photoresist film 500 on a silicon carbide substrate 100 in order.

The epitaxial layer 200 is grown to a predetermined thickness on the upper surface of the silicon carbide substrate 100. The epitaxial layer 200 is grown on the silicon carbide substrate 100 that is an insulating substrate or a non-insulating substrate through a chemical vapor deposition (CVD) method during which the epitaxial layer 200 is doped with N-type impurity.

Here, both the silicon carbide substrate 100 and the epitaxial layer 200 may be an N-type. When the epitaxial layer 200 is grown through the above-described method in the state where an N-type semiconductor layer is provided on the silicon carbide substrate 100, the epitaxial layer 200 doped with an N-type impurity can be formed.

For example, the silicon carbide substrate 100 may be made of any one or more of 3C—SiC, 4H—SiC, and 6H—SiC. The epitaxial layer 200 may be grown through hydride vapor phase epitaxy (HYPE), metal organic chemical vapor deposition (MOCVD), molecular beam epitaxy (MOLE), or sputtering.

Subsequently, the polysilicon layer 300 is deposited on the epitaxial layer 200. The polysilicon layer 300 has many advantages when used as an anode. First, the polysilicon layer 300 can be easily formed using a CVD apparatus at a high temperature, such as 700° C. Therefore, the polysilicon layer 300 is thermally stable. Second, since the polysilicon layer 300 is used in place of a metal in the present invention, etching can be performed without metal contamination. Third, since the polysilicon layer 300 has a lower work function than titanium (Ti), the polysilicon layer 300 can function faithfully as an anode of TSBS.

As illustrated in FIG. 2A, the epitaxial layer 200, the highly doped n-type polysilicon layer 300, and the oxide film 400 formed of silicon dioxide (SiO2), and the photoresist film 500 that are sequentially formed in this order on the silicon carbide substrate 100 are used as etching masks for etching the epitaxial layer 200 made of silicon carbide.

That is, the silicon carbide that is the material of the epitaxial layer 200 and the polysilicon that is the material of the polysilicon layer 300 formed on the epitaxial layer 200 have a poor etching selectivity. For example, the polysilicon layer 300 on the epitaxial layer 200 is likely to be accidently etched. Since the polysilicon layer 300 cannot endure an etching condition when etching the epitaxial layer 200 well and cannot function as an etching mask, the oxide film 400 is to be used as an etching mask when etching the epitaxial layer 200.

In other words, the oxide film 400 on the polysilicon layer 300 can be used as an etching mask to etch both the polysilicon layer 300 and the epitaxial layer 200. When all the processes for manufacturing the diode according to the present invention are completed, the oxide film may be desirably removed.

Particularly, in the case where only the polysilicon layer 300 is etched, the etching can be performed using a photoresist pattern 500' as an etching mask without using the oxide film 400. However, in this case, the silicon carbide that is the material of the epitaxial layer 200 cannot be etched through a self-alignment process. Therefore, the oxide film 400 is necessarily used for self-alignment etching.

For example, the oxide film is preferably silicon dioxide (SiO2) but is not necessarily limited thereto.

Figure 2B:
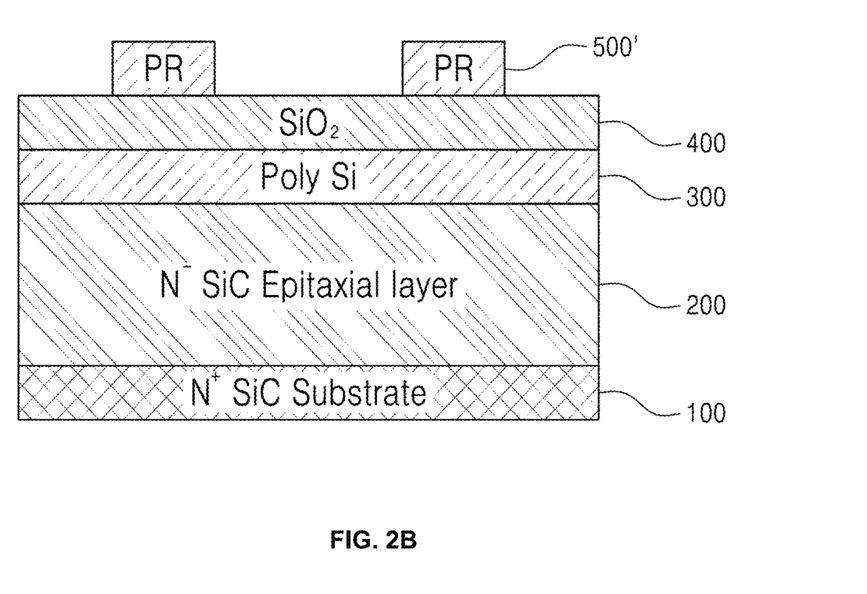
Figure 2C:
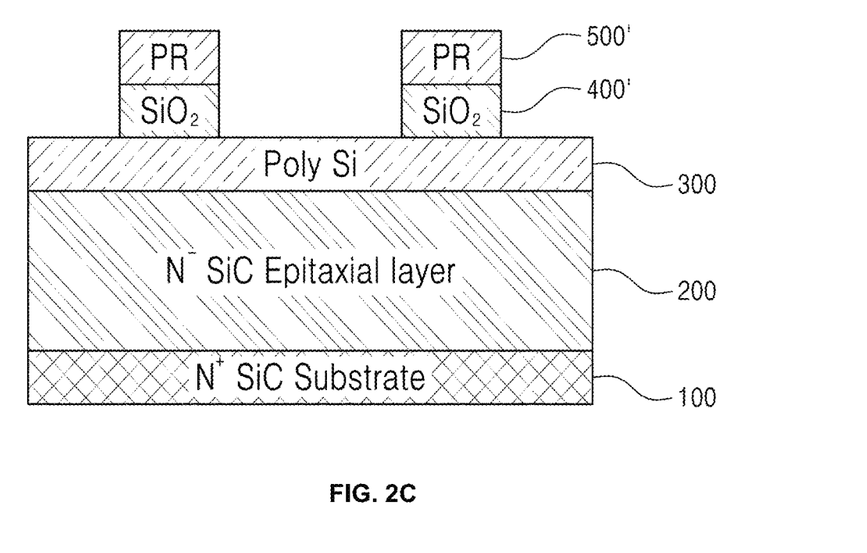

Next, in the second step, the photoresist film 500 is patterned to form the photoresist pattern 500'. The oxide film 400 is etched using the photoresist pattern 500' as an etching mask to form an oxide film pattern 400'.

As illustrated in FIGS. 2B and 2C, after the photoresist film 500 is patterned with a photo lithography apparatus to form the photoresist pattern 500' having a predetermined shape, the oxide film 400 is etched to form the oxide film pattern 400' while using the photoresist pattern 500' as an etching mask. The oxide film pattern 400' formed under the photoresist pattern 500' have the same shape as the photoresist pattern 500'.

Figure 2D:
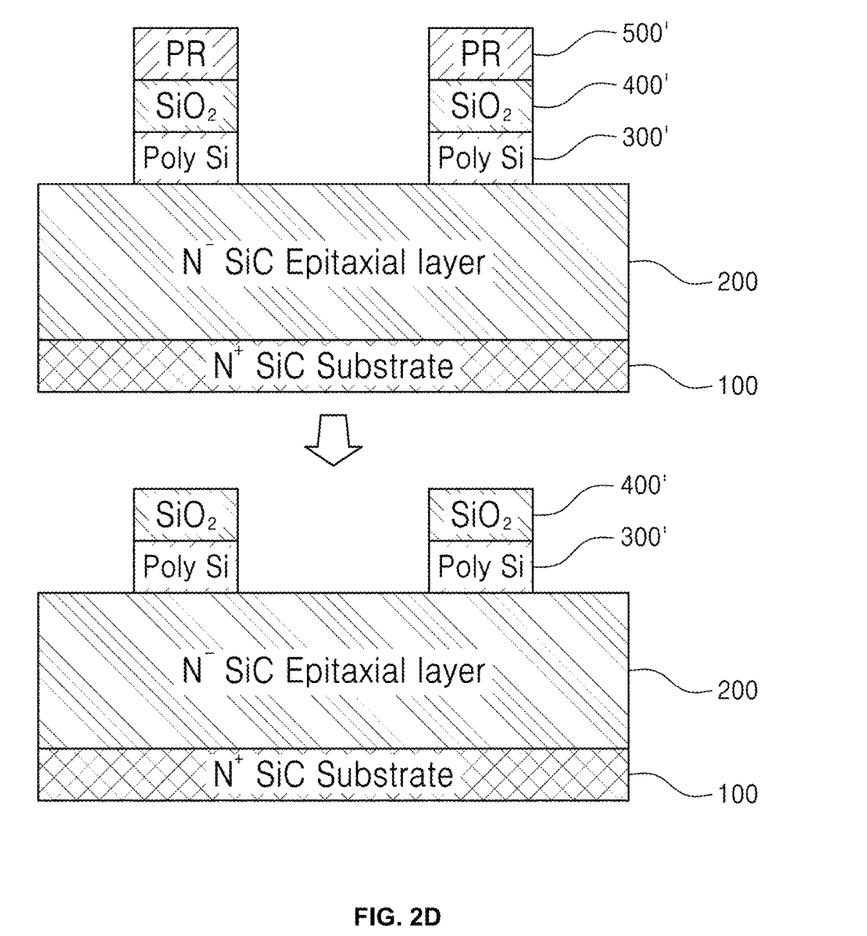

Next, in the third step, the polysilicon layer 300 is etched using the oxide film pattern 400' as an etching mask, thereby forming the polysilicon pattern 300'. Subsequently, the photoresist pattern 500' is removed.

Referring to FIG. 2D, the photoresist pattern 500' is not removed so that it can be used as an etching mask in the subsequent process. That is, the polysilicon layer 300 is etched using the photoresist pattern 500' as an etching mask so that the polysilicon pattern 300' having the same shape and size as the oxide film pattern 400' is formed under the oxide film pattern 400'. After the polysilicon pattern 300' is formed, the uppermost layer (i.e., the photoresist pattern 500') is removed.

Figure 2E:
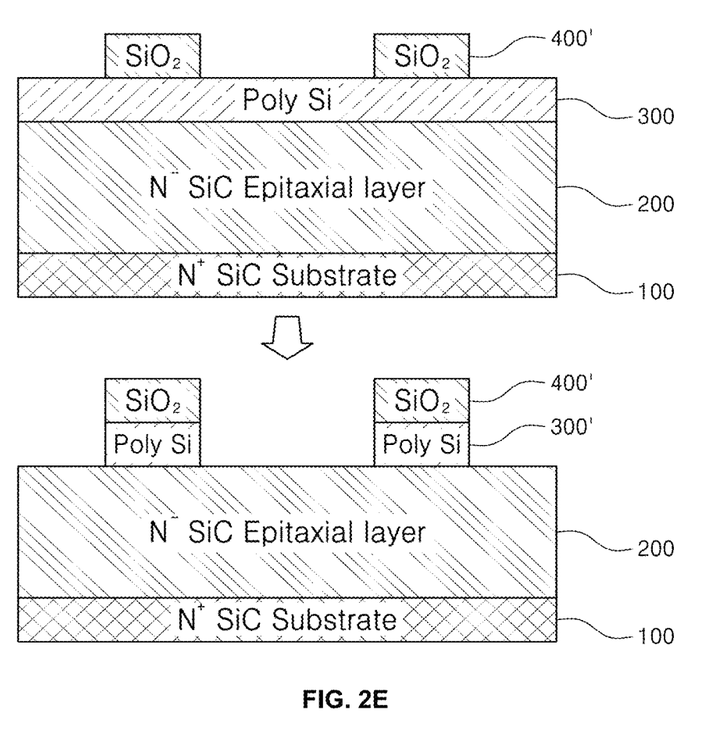

Unlike FIG. 2D, referring to FIG. 2E, the photoresist pattern 500' on the oxide film pattern 400' is removed, and the oxide film pattern 400' is then used as an etching mask when the polysilicon layer 300 is etched to form the polysilicon pattern 300'.

On the other hand, as illustrated in FIG. 2D, with the photoresist pattern 500' being maintained to serve as an etching mask, the polysilicon layer 300 may be etched. Alternatively, as illustrated in FIG. 2E, in a state in which the photoresist pattern 500' is removed, the polysilicon 300 may be etched using the oxide film pattern 400' as a mask.

In particular, the reason why the oxide film 400 and the polysilicon layer 300 are not etched together at the same time but etched in two steps is to obtain a clean etching mask to be used when etching the epitaxial layer 200. Although there is no significant difference between the etching conditions for the oxide film 400 and the polysilicon layer 300, when the photoresist 500 is damaged or partially removed during the etching of the oxide film 400, the etching of the polysilicon 300 cannot be stably performed.

Figure 2F:
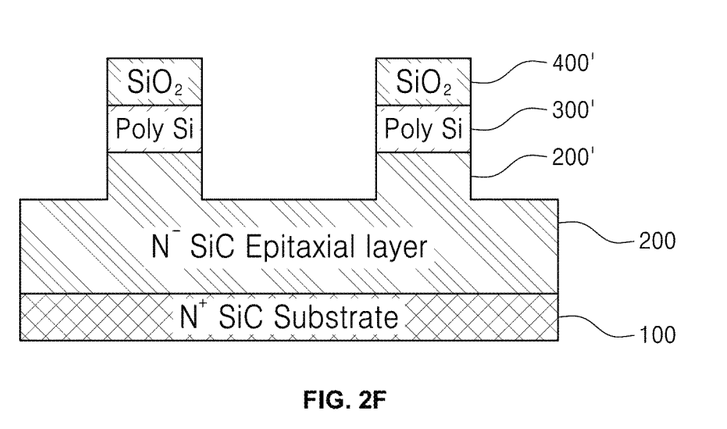
Figure 2G:
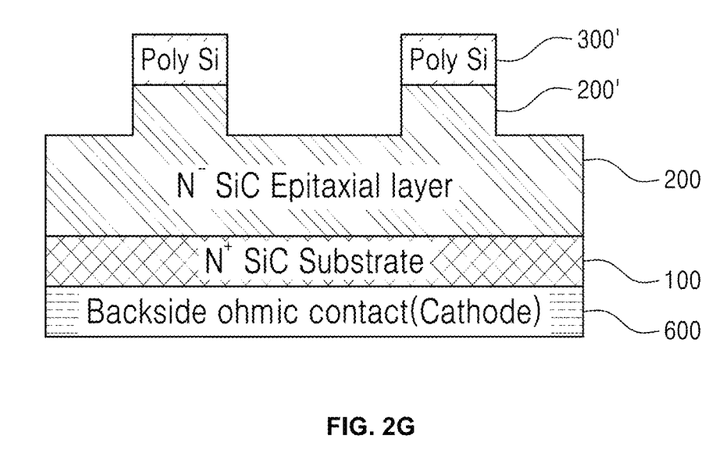

Next, in the fourth step, the epitaxial layer 200 is etched down to a predetermined depth using the oxide film pattern 400' as an etching mask, thereby forming the epitaxial pattern 200'. Next, the oxide film pattern 400's is removed, resulting in a complete trench being formed.

The present invention intends to use the polysilicon layer 300 that has a low work function and is highly doped as a Schottky contact electrode.

That is, in order to use the polysilicon layer 300 as a Schottky contact, it is important to remove the margin illustrated in FIG. 1. In order to remove this margin, a bottom region of the epitaxial layer 200 is etched down to a predetermined depth by using the oxide film pattern 400's as an etching mask (see FIG. 2F).

When the oxide film pattern 400' is removed after the etching of the bottom region of the epitaxial layer 200 is completed, the structure having no margin that is the cause of inefficient space utilization is formed (see FIG. 2G).

In summary, in order to solve the problem of margins that occur when the trench structure is first formed and the electrode is subsequently formed, the present invention employs a technique in which the electrode is formed first and then etching to form the trench is performed.

Accordingly, the oxide film 400, the polysilicon layer 300, and the epitaxial layer 200 may be defined as being self-aligned.

In the case of using a conventional method in which formation of electrodes is performed after formation of trenched is performed, two photo lithography processes and one alignment process are required. The conventional manufacturing method has a problem that a space loss occurs because an alignment margin must be considered through the alignment between the electrodes and the trenches. That is, in the conventional method, the trenches are formed first, the alignment is then performed, electrodes are formed, and etching is performed. In this case, one etching mask is required in the etching process. Next, when a metal layer is deposited and then etched using a photoresist film pattern, another etching mask is required. That is, a total of two etching masks are required.

However, in the present invention, cutting is performed without alignment. Electrode formation and etching are performed with a cutting mask. That is, the oxide film pattern 400' functions as an etching mask for forming trenches and forming electrodes. In the past, the electrodes had to be accurately aligned to be positioned on the trench structure. In the present invention, there is no need to position the electrodes in such a way and the electrodes and the trenches are formed in a self-aligned manner.

For example, as illustrated in FIG. 2G, after removing the oxide film pattern 400' used as an etching mask, it is preferable to arrange the electrodes 600 under the silicon carbide substrate 100. That is, the electrodes 600 for ohmic contact are formed on the lower surface of the silicon carbide substrate 100 through annealing that is performed at a temperature of 950 □ C for 90 seconds with an RTA system. The electrodes 600 serve as cathodes.

Figure 2H:
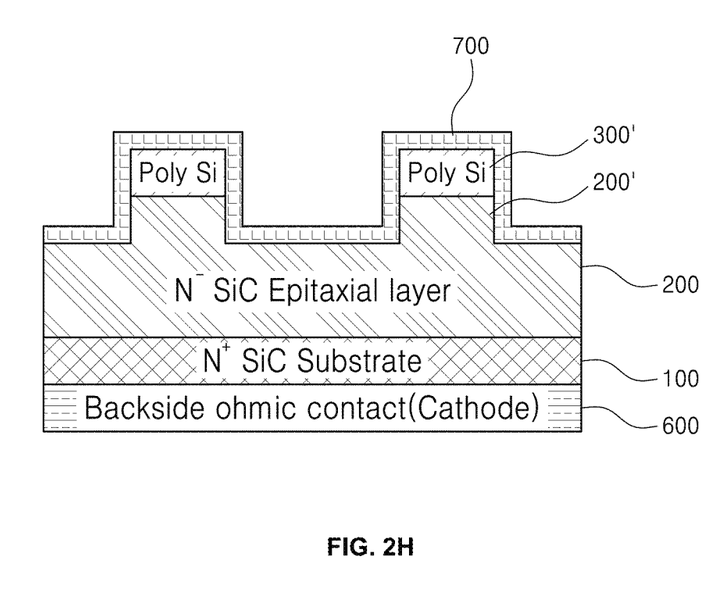

Finally, the fifth step is a process of depositing a metal on the entire surface of the epitaxial layer 200, including the surface of the polysilicon pattern 300'.

That is, as illustrated in FIG. 2H, the fifth step is a process of depositing a metal on the entire area of the surface of the epitaxial layer 200 that forms the trench structure, including the surface of the polysilicon pattern 300' exposed through the removal of the oxide film pattern 400'. The metal is deposited to form a metal layer 700 on the entire area of the epitaxial layer 200 in such a manner that the exposed polysilicon patterns 300' are connected to each other. With this process, formation of the carbide trench Schottky barrier diodes is completed.

In this case, the metal may be any one or more selected from among platinum (Pt), nickel (Ni), gold (Au), palladium (Pd) and molybdenum (Mo), but may not necessarily limited thereto. Any other metal that can replace the exemplary metal may be used.

Hereinafter, various tests of the silicon carbide trench Schottky barrier diode using the polysilicon according to the present invention and tests of the manufacturing method thereof will be described.

Figure 3:
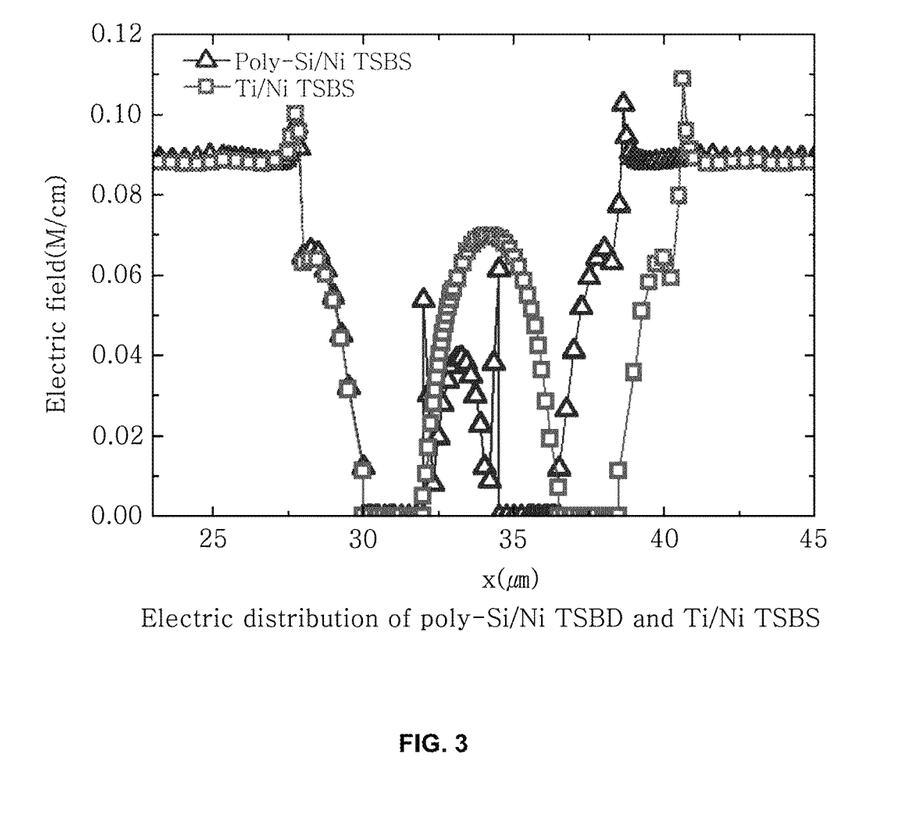
FIG. 3 is a diagram illustrating comparison of electric field distribution among various materials used for a diode according to a preferred embodiment of the present invention.

FIG. 3 is diagram illustrating results of comparison between electric field distributions in the diodes according to a preferred embodiment an of the present invention and a comparative example. That is, FIG. 3 shows the results of comparison between poly Si/Ni TSBS (i.e. a combination of polysilicon and nickel) and Ti/Ni TSBS (i.e., a combination of titanium and nickel). That is, in the case of the poly Si/Ni TSBS, the electric field distribution between both trenches, that is, at the bottom of the polysilicon is reduced compared to the comparative example, thereby exhibiting a good breakdown voltage characteristic. That is, a better shielding effect can be obtained.

Figure 4:
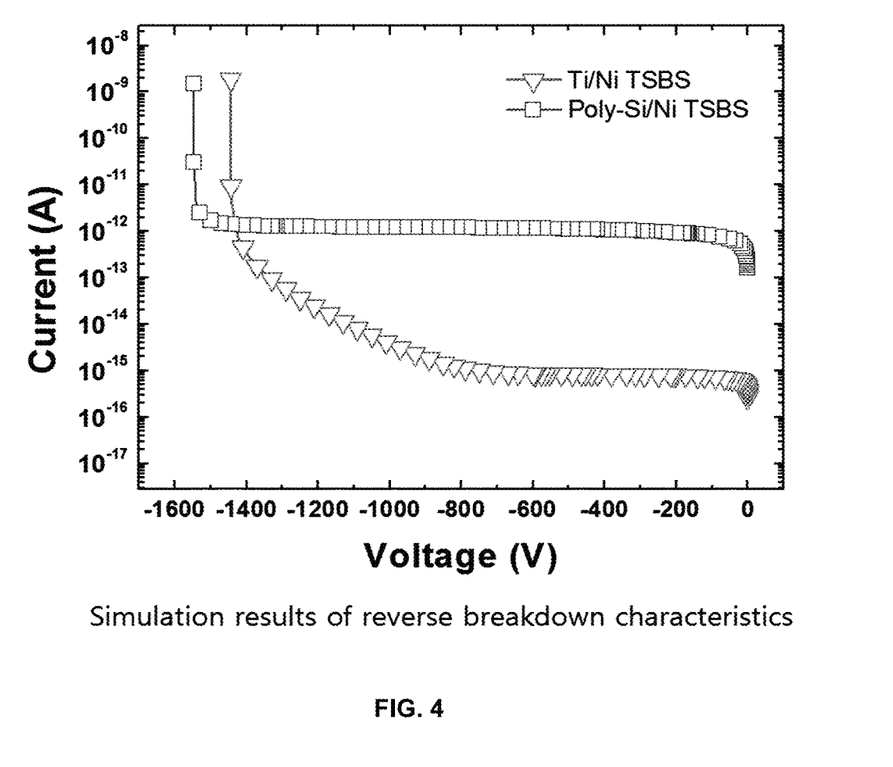
FIG. 4 is a diagram illustrating a simulation result of a reverse breakdown characteristic of a diode according to a preferred embodiment of the present invention.

FIG. 4 is a diagram illustrating the results of a simulation of a reverse breakdown characteristic of diodes according to a preferred embodiment of the present invention and a comparative example. Referring to FIG. 4, a poly Si/Ni TSBS that is a combination of polysilicon and nickel has a more effective shielding effect than a Ti/Ni TSBS that is a combination of titanium and nickel. From this, it is noted that the poly Si/Ni TSBS has a higher breakdown voltage.

Figure 5:
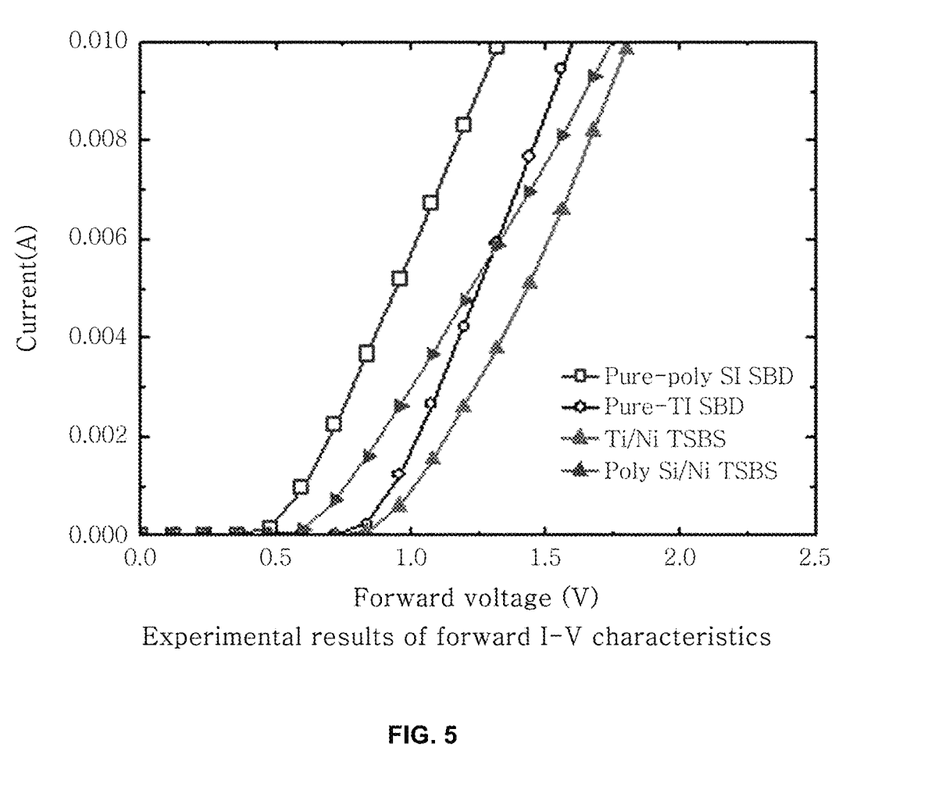
FIG. 5 is a diagram illustrating a result of a test for a relationship between current and forward bias voltage, the test being performed on a diode according to a preferred embodiment of the present invention.

FIG. 5 is diagram illustrating the results of a test for current-forward voltage characteristics of diodes according to a preferred embodiment of the present invention and a comparative example. Referring to FIG. 5, a poly-Si/Ni TSBS in which polysilicon and nickel are combined has a lower turn on voltage than a Ti/Ni TSBS in which titanium and nickel are combined due to a lower Schottky barrier.

Figure 6:
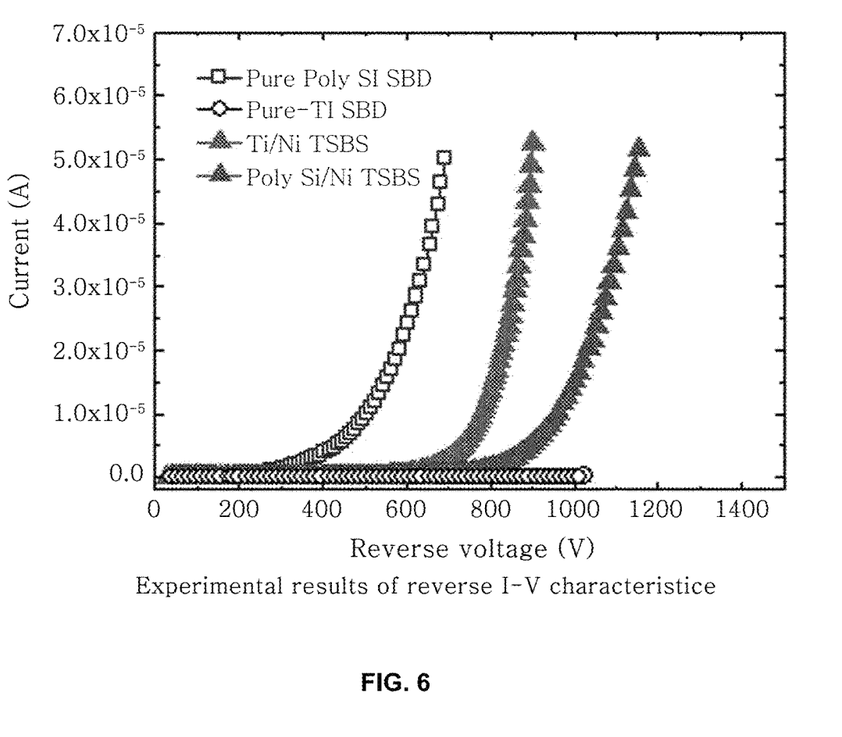
FIG. 6 is a diagram illustrating a result of a test for a relationship between current and reverse bias voltage, the test being performed on a diode according to a preferred embodiment of the present invention.

FIG. 6 is a diagram illustrating the results of a test for current-reverse voltage characteristics of diodes according to a preferred embodiment of the present invention and comparative examples. Referring to FIG. 6, the reverse characteristics of a poly-Si/Ni TSBS, a Ti/Ni TSBS, and various SBDs can be compared. In particular, the reverse breakdown voltage of the poly-Si/Ni TSBS is higher than that of each of a poly-Si SBD, a Ti SBD, and a Ti/Ni TSBS. Accordingly, the poly-Si/Ni TSBS exhibits the best shielding effect against an electric field at a low Schottky barrier anode. Therefore, in the case of the Poly Si/Ni TSBS, the anode with a low work function can be effectively shielded due to a self-aligning process.

The above description is merely illustrative of the technical idea of the present invention, and those skilled in the art to which the present invention pertains may make various modifications and changes without departing from the essential characteristics of the present invention.

Therefore, the embodiments disclosed in the present invention are not intended to limit the technical idea of the present invention, but to describe the present invention, and the scope of the technical idea of the present invention is not limited by these embodiments.

The protection scope of the present invention should be interpreted based on the claims, and all technical ideas within the scope of equivalents should be interpreted as being included in the scope of the present invention.

What is claimed is:

1. A method of manufacturing a silicon carbide trench Schottky barrier diode using polysilicon, the method comprising:
   a first step of sequentially forming an epitaxial layer, a polysilicon layer, an oxide film, and a photoresist film on a silicon carbide substrate;
   a second step of patterning the photoresist to form a photoresist pattern and then etching the oxide film using the photoresist pattern as an etching mask to form an oxide film pattern;
   a third step of forming a polysilicon pattern by etching the polysilicon film using the oxide film pattern as an etching mask and then removing the photoresist pattern; and
   a fourth step of forming an epitaxial pattern by etching a bottom region of the epitaxial layer down to a predetermined depth using the oxide film pattern as an etching mask and then removing the oxide film pattern to complete a trench.

2. The method according to claim 1, wherein in the fourth step, an electrode is provided on a lower surface of the silicon carbide substrate.

3. The method according to claim 1, wherein further comprising a fifth step of depositing a metal on the entire surface of the epitaxial layer, including a surface of the polysilicon pattern, the fifth step being performed after the fourth step.

4. The method according to claim 3, wherein the metal in the fifth step is any one or more selected from among platinum (Pt), nickel (Ni), gold (Au), palladium (Pd), and molybdenum (Mo).

5. The method according to claim 1, wherein the oxide film in the first step is made of silicon dioxide (SiO2).

6. A silicon carbide trench Schottky barrier diodes using polysilicon, the diode being formed using an epitaxial layer, a polysilicon layer, an oxide film, and a photoresist film that are sequentially stacked in this order on an upper surface of a silicon carbide substrate, the diode comprising:
   the silicon carbide substrate;
   an epitaxial pattern formed by etching a bottom region of the epitaxial layer;
   a polysilicon pattern formed on the epitaxial pattern;
   a metal layer formed on the entire surface of the epitaxial layer, including a surface of the polysilicon pattern; and
   an electrode formed on a lower surface of the silicon carbide substrate,
   wherein the epitaxial pattern and the polysilicon pattern are self-aligned.

7. The diode of claim 6, wherein the metal layer is made of at least one metal selected from among platinum (Pt), nickel (Ni), gold (Au), palladium (Pd), and molybdenum (Mo).

8. The diode of claim 6, wherein the oxide film is made of silicon dioxide (SiO2).

* * * * *